United States Patent
Li et al.

(10) Patent No.: US 7,729,453 B1
(45) Date of Patent: Jun. 1, 2010

(54) SYSTEM AND METHOD FOR FAST DYNAMIC ADJUSTMENT OF SLICING LEVEL FOR BURST MODE OPTICAL RECEIVERS

(76) Inventors: Bing Li, 7565 Charmant Dr., #609, Dan Diego, CA (US) 92122; David Wolf, 810 Youpon Dr., Allen, TX (US) 75002; James Plesa, 4067 Beltway Dr., Addison, TX (US) 75001; Lakshman S. Tamil, 4812 Holly Berry Dr., Plano, TX (US) 75093

( * ) Notice: Subject to any disclaimer, the term of this patent is extended or adjusted under 35 U.S.C. 154(b) by 1073 days.

(21) Appl. No.: 10/423,480

(22) Filed: Apr. 25, 2003

Related U.S. Application Data (60) Provisional application No. 60/375,663, filed on Apr. 26, 2002.

(51) Int. Cl.
*H04L 25/10* (2006.01)
(52) U.S. Cl. .................. 375/317; 375/316; 375/318; 375/286; 375/287; 327/58; 327/59; 327/61; 327/89; 327/72; 327/306; 327/309; 327/314
(58) Field of Classification Search .............. 375/316, 375/286, 287, 317
See application file for complete search history.

(56) References Cited

U.S. PATENT DOCUMENTS

| | | | | |
|---|---|---|---|---|
| 4,166,784 A | * | 9/1979 | Chapin et al. | 204/192.13 |
| 4,873,457 A | * | 10/1989 | Sanielevici | 327/93 |
| 5,308,971 A | * | 5/1994 | Pope et al. | 250/214 VT |
| 5,430,766 A | * | 7/1995 | Ota et al. | 375/318 |
| 5,570,052 A | * | 10/1996 | Fonderie et al. | 327/205 |
| 5,764,598 A | | 6/1998 | Okayasu | |
| 5,923,219 A | * | 7/1999 | Ide et al. | 330/308 |
| 6,069,499 A | * | 5/2000 | Cho et al. | 327/58 |
| 6,178,213 B1 | | 1/2001 | McCormack et al. | |
| 6,208,173 B1 | * | 3/2001 | Redman-White | 327/59 |
| 6,509,990 B1 | | 1/2003 | Roberts | |
| 6,595,708 B1 | * | 7/2003 | Yamashita | 398/202 |
| 6,735,162 B2 | * | 5/2004 | Armitage et al. | 369/124.11 |
| 6,735,260 B1 | * | 5/2004 | Eliezer et al. | 375/316 |
| 6,771,719 B1 | | 8/2004 | Koyama et al. | |
| 7,058,150 B2 | | 6/2006 | Buchwald et al. | |
| 2001/0021051 A1 | | 9/2001 | Kim | |
| 2002/0027692 A1 | | 3/2002 | Uchiyama et al. | |
| 2002/0057479 A1 | | 5/2002 | Takeshita et al. | |

* cited by examiner

*Primary Examiner*—Chieh M Fan
*Assistant Examiner*—Siu M Lee
(74) *Attorney, Agent, or Firm*—Connolly Bove Lodge & Hutz LLP (57) ABSTRACT

Systems and methods for determining a slicing level which is used as a threshold to determine whether timeslots of an incoming data signal contain ones or zeros. The method of one embodiment comprises receiving a data signal, identifying a maximum level of the data signal, identifying a minimum level of the data signal, determining an average of the minimum and maximum levels, and then using the average of the minimum and maximum levels as a slicing level to identify bits of a data packet embodied in the data signal.

9 Claims, 7 Drawing Sheets

SYSTEM AND METHOD FOR FAST DYNAMIC ADJUSTMENT OF SLICING LEVEL FOR BURST MODE OPTICAL RECEIVERS

RELATED APPLICATIONS

This application claims priority to U.S. Provisional Patent Application No. 60/375,663, entitled "Apparatus and Method for High Bit Rate Burst Mode Receiver", filed Apr. 26, 2002 by Bing Li, et al., which is incorporated by reference as if set forth herein in its entirety.

FIELD OF THE INVENTION

The invention relates generally to data communications and more particularly to systems and methods for setting a level for slicing incoming data signals, wherein the slicing level provides a threshold signal level above which a data signal level is considered to be a 1 and below which a data signal level is considered to be a 0.

BACKGROUND OF THE INVENTION

In packet switching data transmission systems (e.g., optical packet switching systems) the data signal which arrives at a receiver is in a burst mode. The incoming signal, although representative of binary data, is actually an analog signal that must be interpreted as binary data. This is important to note because the signal levels of the data arriving in burst mode may have widely varying values. In other words, the signal level which constitutes a 1 may be substantially different from one packet to another. Likewise, the signal level which constitutes a 0 may be very different from one packet to another. These signal levels may vary by as much as 10 dB (although it should be noted that the variation depends upon the size and configuration of the system).

Because the signal levels can vary in this manner, it is necessary to identify an appropriate slicing level for each packet in order to be able to properly interpret the data bits in the packet. The slicing level is the signal level above which a data signal is considered to be a 1 and below which a data signal is considered to be a 0. Once the slicing level is determined, the analog signal can be interpreted as binary 1's and 0's.

While there are several conventional approaches for identifying slicing levels, these approaches have drawbacks which make them inadequate for use in high-speed optical burst-mode transmission systems. For example, one approach is a sample-and-hold integration approach. Sample-and-hold integration methods require a sample-and-hold pulse that is synchronized with the incoming data. The accuracy of the slicing levels determined by these methods can be directly affected by the accuracy of the synchronization. If, for instance, the sampling window is not in alignment with the data packet, the method will integrate a portion of the packet and the remainder of the packet may comprise noise. Since the noise is unrelated to the data signal levels, it will obviously affect the integration calculation. In an optical burst-mode transmission system, it may not be possible (there may not be enough time) to synchronize the sample-and-hold pulse with the packet.

Another conventional approach for identifying a slicing level is a feed-forward peak detector approach. This approach does not require the synchronization pulse of the sample-and-hold methods, and instead uses a reset pulse that can easily be provided. Implementation of the feed-forward peak detector approach in an optical burst-mode system, however, requires that the photodetector be DC-coupled to the limiting amplifier which serves as the decision circuit. This prevents the use of a trans-impedance amplifier with a low-end cut-off frequency.

Yet another conventional approach uses a fast AGC (automatic gain control) loop. The AGC loop uses a self-adjustable pre-amplifier to convert varying levels of incoming data to a stable signal level. The stabilized-level signal can then be properly interpreted by a subsequent digitizing circuit. AGC loops, however, are generally relatively slow and consequently cannot be used in a system with a bit rate greater than 10 Gbps.

SUMMARY OF THE INVENTION

One or more of the problems outlined above may be solved by the various embodiments of the invention. Broadly speaking, the invention comprises systems and methods for determining a slicing level which is used as a threshold to determine whether timeslots of an incoming data signal contain ones or zeros. One embodiment of the present invention comprises the method of receiving a data signal, identifying a maximum level of the data signal, identifying a minimum level of the data signal, determining an average of the minimum and maximum levels, and then using the average of the minimum and maximum levels as a slicing level to identify bits of a data packet embodied in the data signal.

Another embodiment of the present invention comprises a system having a top-hold circuit configured to identify a maximum level of a received data signal, a bottom-hold circuit configured to identify a minimum level of the data signal, and a slicing level circuit configured to identify a slicing level between the minimum and maximum levels of the data signal. The average signal level may be selected as the intermediate, slicing level. In one embodiment, the top-hold circuit comprises a capacitor that is charged from a low (possibly negative) initial level to the maximum signal level. A rectifier such as a diode controls current flow so that the capacitor is charged to the maximum signal level. The bottom-hold circuit likewise comprises a capacitor and a rectifier (e.g., diode) which is oriented to allow the opposite current flow to charge the capacitor to the minimum signal level. The top-hold and bottom-hold circuits may include operational amplifiers or transistors to increase current flow and more closely approximate the performance of an ideal diode.

Numerous additional embodiments are also possible. The various embodiments of the invention may provide a number of advantages over the prior art. For example, one or more embodiments do not require synchronization with the incoming data, as needed in sample-and-hold circuits. Another advantage of one or more embodiments is that they do not need to be DC-coupled between the photodetector and the limiting amplifier. Yet another advantage of some embodiments is that they are fast enough to be used in systems that operate at rates of 10 Gbps or more.

BRIEF DESCRIPTION OF THE DRAWINGS

Other objects and advantages of the invention may become apparent upon reading the following detailed description and upon reference to the accompanying drawings.

While the invention is subject to various modifications and alternative forms, specific embodiments thereof are shown by way of example in the drawings and the accompanying detailed description. It should be understood, however, that the drawings and detailed description are not intended to limit the invention to the particular embodiment which is described. This disclosure is instead intended to cover all modifications, equivalents and alternatives falling within the scope of the present invention as defined by the appended claims.

DETAILED DESCRIPTION

A preferred embodiment of the invention is described below. It should be noted that this and any other embodiments described below are exemplary and are intended to be illustrative of the invention rather than limiting.

Broadly speaking, the invention comprises systems and methods for identifying minimum and maximum signal levels and selecting an intermediate level as a slicing or threshold level. In one embodiment, an incoming data signal is used to charge a first circuit to a minimum signal level and to charge a second circuit to a maximum signal level. The average of these two levels is then selected as a slicing level for the data in the incoming signal. (The "average" need not be exact, and in fact other values which are intermediate to the minimum and maximum signal levels may alternatively be chosen as the slicing level.) This is referred to generally herein as a top-bottom-hold approach.

Figure 1:
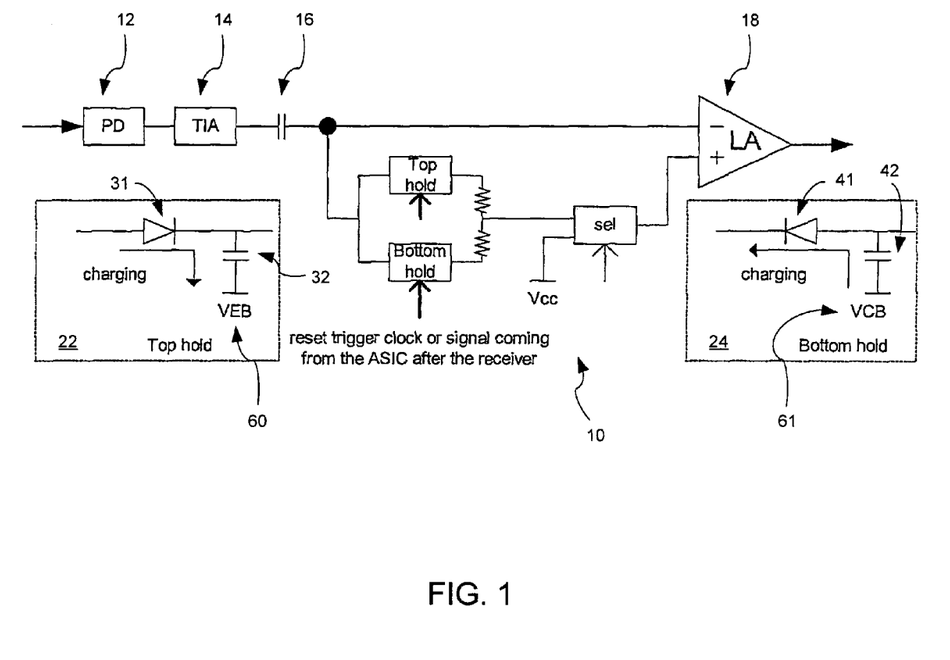
FIG. 1 is a functional block diagram illustrating a top-bottom-hold circuit using ideal diodes in accordance with one embodiment.

Referring to FIG. 1, a functional block diagram illustrating a top-bottom-hold circuit in accordance with one embodiment of the present system is shown. As depicted in this figure, an optical signal is received by photodetector 12, which generates a signal that is transmitted to trans-impedance amplifier 14. The signal generated by trans-impedance amplifier 14 is then coupled through capacitor 16 to limiting amplifier 18. Top-bottom-hold circuit 10 taps into the signal transmitted to limiting amplifier 18 and generates a slicing level signal that is fed back to the limiting amplifier. Limiting amplifier 18 then produces a binary signal corresponding to the received optical signal.

Top-bottom-hold circuit 10 comprises a top-hold component 22 and a bottom-hold component 24. Top-hold component 22 comprises a diode 31 and a capacitor 32. When the signal received from capacitor 16 is positive with respect to VEB (the voltage of battery 60), current flows through diode 31 and charges capacitor 32. If the signal is negative with respect to VEB, no current flows through diode 31. When the signal received from capacitor 16 is negative with respect to VCB (the voltage of battery 61), current flows through diode 41 and charges capacitor 42. If the signal is positive with respect to VCB, no current flows through diode 41. Top-hold component 22 therefore charges to the maximum signal level, while bottom-hold component 24 charges to the minimum signal level.

It should be noted that, if VEB is set at a voltage which is greater than the maximum signal level for the received data, top-hold component 22 will remain at this level, rather than charging to the maximum signal level. VEB should therefore be set at a voltage which is less than the lowest possible maximum signal level. This will ensure that this component will charge up to the maximum signal level. Likewise, VCB should be set at a voltage which is high enough that it will necessarily charge down to the minimum signal level.

Since the minimum and maximum signal levels, as well as the slicing level, have to be determined for every incoming packet, the top-hold and bottom-hold circuits have to be repeatedly reset to their respective initial voltages (VEB and VCB). For the purposes of this disclosure, receipt of a new packet is considered a reset event that will cause re-initialization of the detected minimum and maximum signal levels. There may also be other reset events which will trigger initialization of the detected signal levels.

The top-bottom-hold circuit of FIG. 1 assumes an ideal diode. Because all diodes have a characteristic voltage drop before they break down and allow current to flow through them, this assumption is unrealistic. While the circuit may still function to some extent, it is preferred to substitute a top-bottom-hold circuit that approximates the behavior of ideal diodes. One such circuit is shown in FIG. 2.

Figure 2:
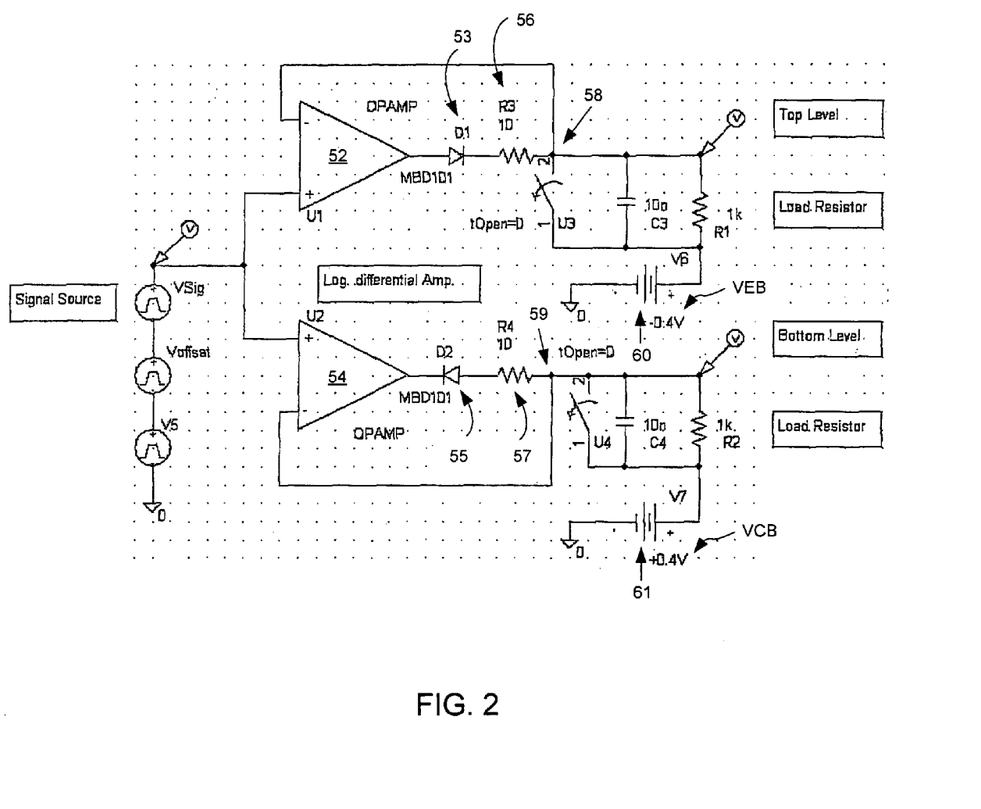
FIG. 2 is a schematic diagram illustrating a top-bottom-hold circuit using a rectifier circuit in accordance with one embodiment.

Referring to FIG. 2, a schematic diagram illustrating a top-bottom-hold circuit in accordance with one embodiment. In this circuit, log differential operational amplifiers (OP AMPs) 52 and 54 are placed between the incoming signal and diodes 53 and 55. Resistors 56 and 57 are also placed in series with the diodes. The output levels at points 58 (maximum) and 59 (minimum) are then fed back into their respective OP AMPs. VEB (the initial voltage of the maximum detected signal level) is set at −0.4 volts by battery 60. This voltage is the lowest possible maximum signal level in this embodiment. VCB (the initial voltage of the minimum detected signal level) is set at +0.4 volts by battery 61, which is the highest possible minimum signal level in this embodiment.

VEB and VCB are set at these voltage levels in order to ensure that the actual signal levels cause some current flow and pull the detected signal levels toward the actual levels. If, for example, VEB were set at a level greater than the actual maximum signal level, it would remain at this initial level because current would have to flow against the diodes to reach the actual signal level.

Figure 3:
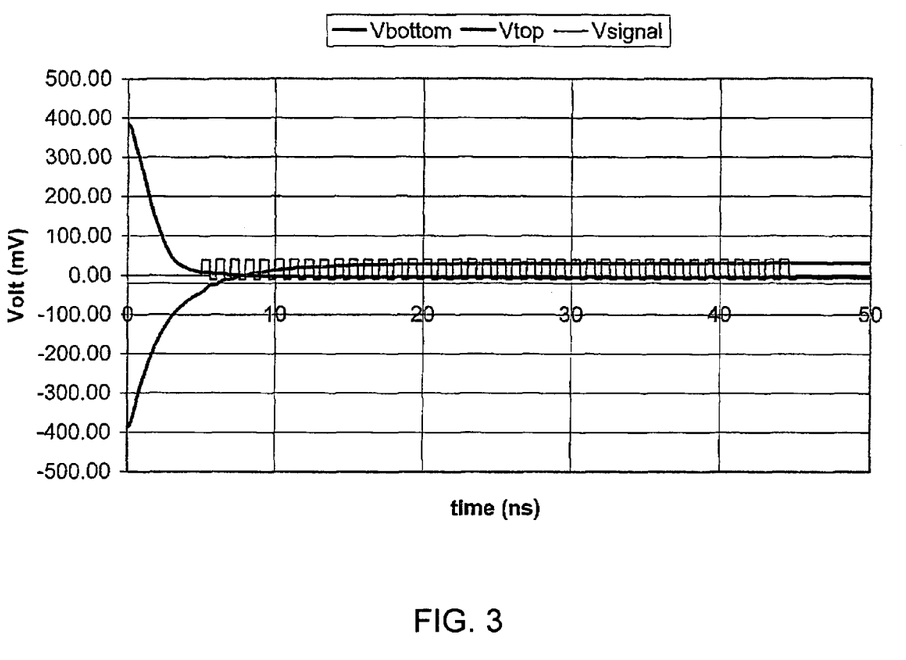
FIG. 3 is a graph showing a pair of curves representing the top-hold (maximum) and bottom-hold (minimum) signal levels superimposed on an incoming signal level, where the signal has a maximum of 50 millivolts and a minimum of 0 millivolts.
Figure 4:
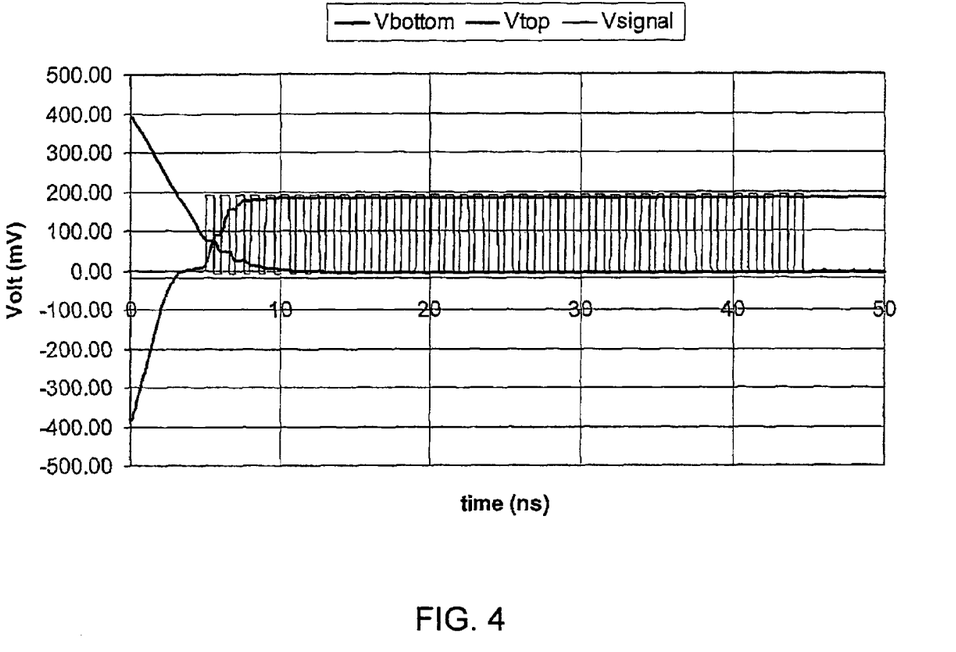
FIG. 4 is a graph showing a pair of curves representing the top-hold and bottom-hold signal levels superimposed on an incoming signal level, where the signal has a maximum of 200 millivolts and a minimum of 0 millivolts.

The simulated performance of the circuit of FIG. 2 is shown in FIGS. 3 and 4. Referring to FIG. 3, a pair of curves representing the top-hold (maximum) and bottom-hold (minimum) signal levels are shown superimposed on a graph of the incoming signal level, where the signal has a maximum of 50 millivolts and a minimum of 0 millivolts. It can be seen from the figure that the detected top-hold and bottom-hold levels settle by about 10 ns after receipt of the data begins. While the bottom-hold level is at about 0 millivolts, the top-hold level is about 5 millivolts below the actual maximum signal level of 50 millivolts. This is caused by the limited gain (a small signal gain of 100) of log differential amplifier 52.

Referring to FIG. 4, a pair of curves representing the top-hold and bottom-hold signal levels are shown superimposed on a graph of the incoming signal level, where the signal has a maximum of 200 millivolts and a minimum of 0 millivolts.

The top-hold and bottom-hold signal levels settle very quickly (under 10 ns). Again, the bottom-hold level settles at about 0 millivolts, while the top-hold level settles at about 5 millivolts below the actual maximum signal level of 200 millivolts.

The top-bottom-hold circuitry and methodology described herein are intended to identify the minimum and maximum levels of an incoming data signal. It should be noted that, as used herein, detecting the minimum and maximum levels in the incoming data signal does not imply any particular accuracy. In other words, the circuitry is contemplated to be detecting a signal level by charging to the level of the signal— it is not necessary that the circuitry come within a predetermined range of the signal. Thus, in the examples of FIGS. 3 and 4, the upper signal levels are considered to have been detected, even though the circuitry was charged to a level 5 millivolts below the actual maximum signal level. Similarly, the circuitry is detecting the signal levels even initially when the circuitry is charged to +/−0.4 volts but is moving toward the actual signal level.

Figure 5:
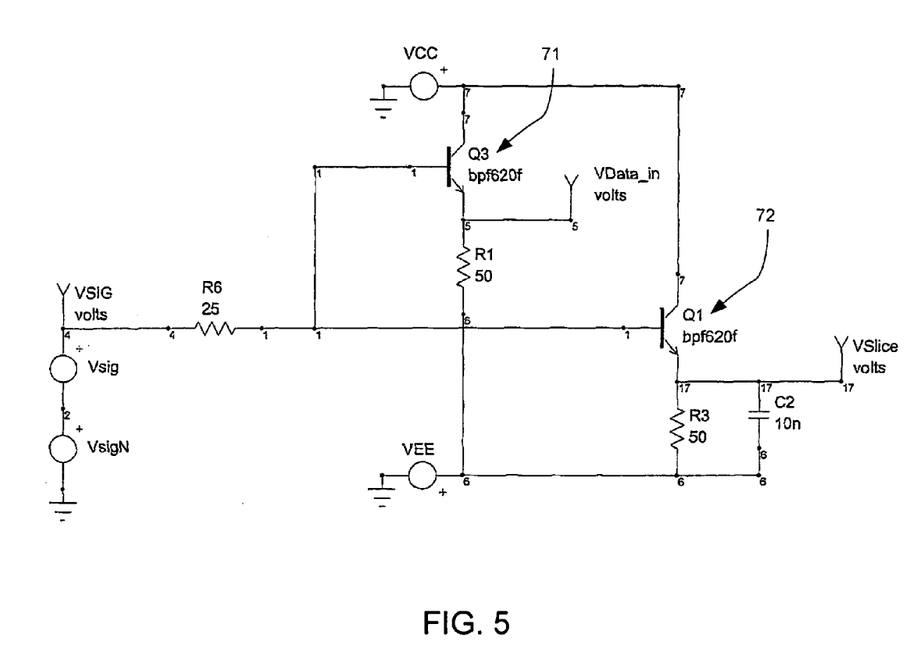
FIG. 5 is a diagram illustrating alternative embodiment of a top-hold circuit having a double emitter-follower configuration.

The top-and-bottom hold circuit can be designed in many different ways. Another alternative embodiment comprises a double emitter-follower top-hold circuit as shown in FIG. 5. This circuit may settle more rapidly at the minimum and maximum signal levels because the current gain of transistor 71 reduces the charging time constant. A similarly configured transistor 72 is used to buffer the data so that the data and the slicing level will have the same $V_{BE}$ drop.

Another approach to setting the slicing level for received data involves looking up data for received packets in a table containing slicing level information. Most optical packet switching systems are synchronized. In other words, the proper operation of these systems requires that specified actions take place at scheduled times. In one system, data packets are transmitted according to a predetermined schedule. The system assumes that a packet in a certain time slot has corresponding source and destination nodes. The packet received by the system in that time slot is therefore routed to the destination node.

Because the nodes connected to the switching system have a static physical configuration, the signals originating at each node will have characteristics corresponding to that node. For instance, a particular node may have slightly different output signal levels than other nodes. The node is also connected to the switching system by a certain length of fiber which may be different from other nodes and which may attenuate the signal by a different amount.

The characteristics associated with a given node will generally change slowly, if at all. The switching system can therefore store information relating to these characteristics. When a packet is received from a particular node (as determined by the switching schedule) the corresponding stored information can be retrieved and used to determine an appropriate slicing level for the packet.

Figure 6:
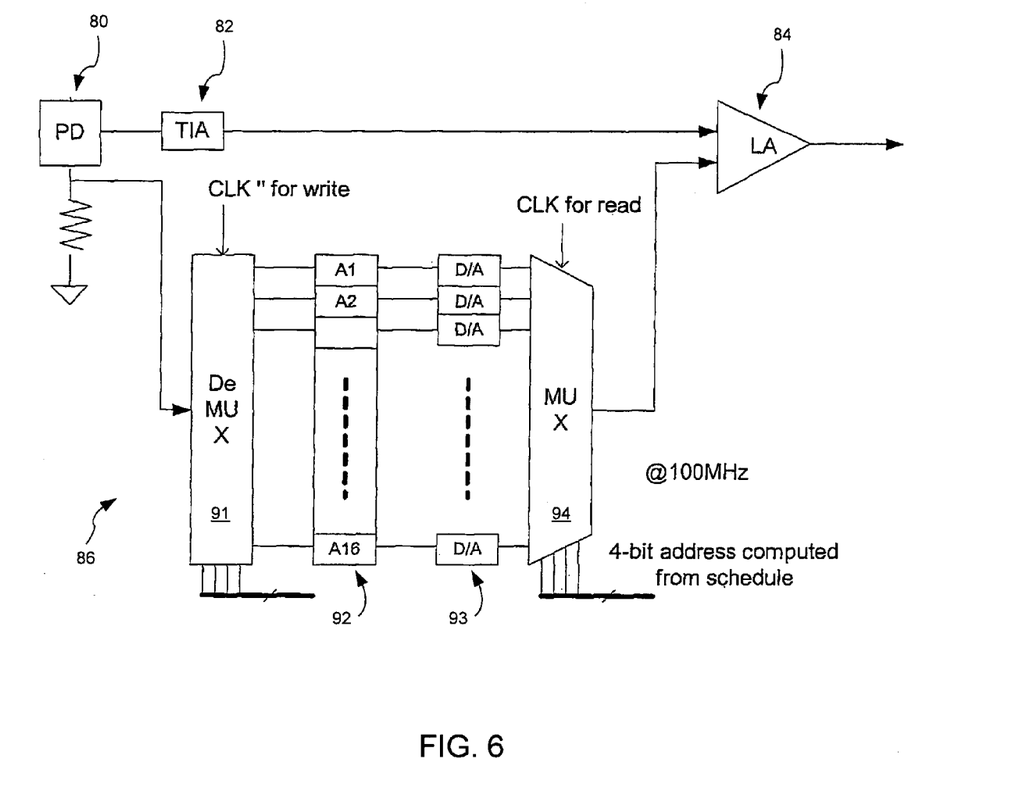
FIG. 6 is a diagram illustrating one embodiment of a system utilizing a look-up table approach for determining the proper slicing level for an incoming data signal.

Referring to FIG. 6, one embodiment of a system utilizing the look-up table approach for determining the proper slicing level is shown. In this embodiment, photodetector 80 generates a data signal which is passed through trans-impedance amplifier 82 and transmitted to limiting amplifier 84. The signal from photodetector 80 is also fed into slicing level circuit 86, which generates a slicing level for the data and feeds this level into limiting amplifier 84.

In this embodiment, slicing level circuit 86 is configured to provide multiple paths for the processing of the data signal received from photodetector 80. Each of these paths is configured to process the data using information corresponding to a particular source node. When the source node for the data is identified, it is used to select the one of the processing paths which corresponds to the identified source node.

In slicing level circuit 86 of FIG. 6, the data signal is converted by demultiplexer 91 into a plurality of parallel data streams. Each of these data streams is fed into a register 92.

The value stored in each register 92 is converted to an analog slicing level signal by D/A converter 93. Multiplexer 94 then selects the slicing level generated from the information for the source node that is identified for the data packet. This slicing level is fed into limiting amplifier 84, which generates the binary output signal.

It is contemplated that the slicing level information corresponding to each node can be generated during an initialization period (e.g., when the switching system is booted, or when the node becomes operational). This information may remain static until the next initialization period, or it may be updated during operation of the system. Since data packets are periodically received from each source node, a new slicing level may be computed for one or more of the packets and the new slicing levels may be used to update the previously stored slicing level information.

It should also be noted that the slicing level information which is stored by the system may be in a variety of forms. For example, it may comprise the slicing level itself, minimum signals levels, maximum signal levels, etc. Circuitry appropriate for using the stored information would, of course, be required.

Another problem that arises in switched packet systems is the shifting of the VCO frequency in the periods between packets. These periods may be referred to as "dark time". During dark time, the PLL has no incoming clock signal with which to synchronize itself. Consequently, the frequency of the PLL's internal clock may drift. This is a problem because it generally takes longer for the PLL to adjust the frequency of its internal clock to synchronize with the incoming data than to adjust its phase. Frequency shifts during dark time may therefore substantially impair the ability of a receiver to handle high-speed data packets.

Figure 7:
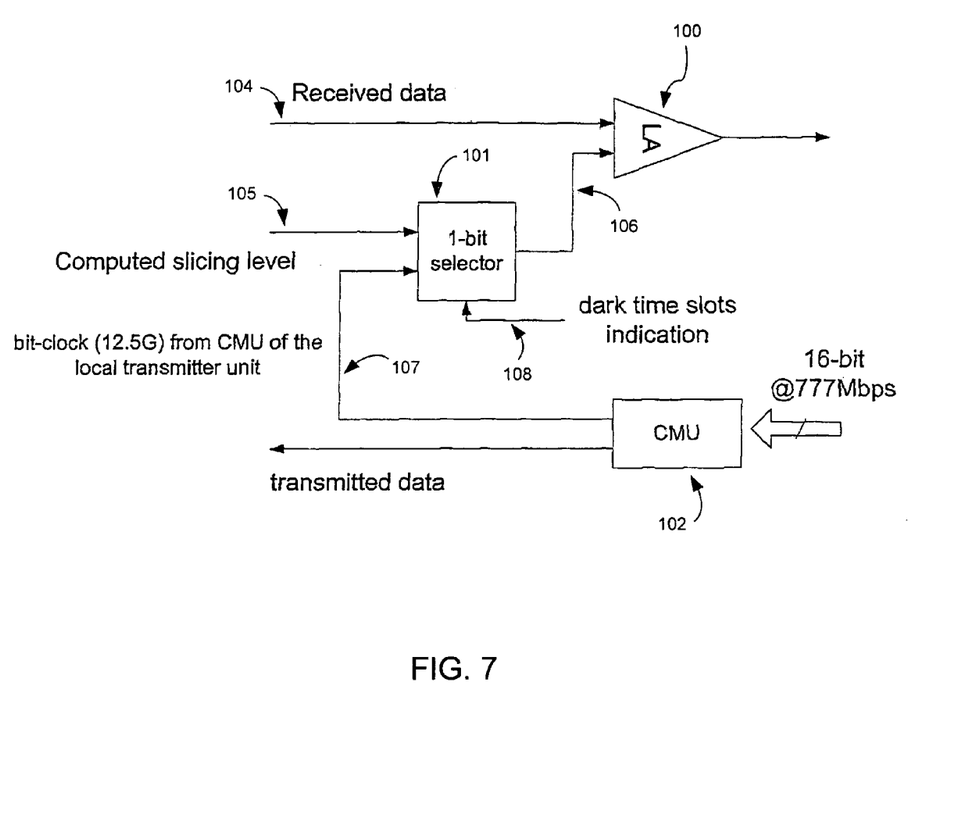
FIG. 7 is a schematic diagram illustrating one embodiment of a circuit designed to minimize frequency shift during dark time in a data packet receiver.

In one embodiment, the present system takes advantage of the presence of a transmitter (or, more specifically, the transmitter's clock) in close proximity with the receiver by using the transmitter's internal clock as a target signal with which the receiver PLL can synchronize itself. Referring to FIG. 7, a schematic diagram of one embodiment of a circuit designed to minimize frequency shift during dark time is shown.

In FIG. 7, a data signal is received by limiting amplifier 100 via line 104. a slicing level is generated by circuitry as described above and is input to selector 101 via line 105. While data is being received, selector 101 passes the slicing level signal through to limiting amplifier 100 via line 106. A second input to selector 101 is received via line 107 from the transmitter clock source (in this case, clock multiplier unit 102). When data is not being received, a dark time indicator signal is asserted on line 108, which is coupled to a control input of selector 101. Thus, when no data is being received (hence there is no data clock to lock in to), the transmitter clock is fed into limiting amplifier 100 in place of the slicing level signal, and a signal corresponding to the transmitter clock signal is produced at the output of the limiting amplifier. The receiver PLL can lock on to this signal and thereby be prevented from experiencing a frequency shift during dark time.

The benefits and advantages which may be provided by the present invention have been described above with regard to specific embodiments. These benefits and advantages, and any elements or limitations that may cause them to occur or to become more pronounced are not to be construed as a critical, required, or essential features of any or all of the claims. As used herein, the terms "comprises," "comprising," or any other variations thereof, are intended to be interpreted as non-exclusively including the elements or limitations which follow those terms. Accordingly, a process, method, article, or apparatus that comprises a list of elements does not include only those elements but may include other elements not expressly listed or inherent to the claimed process, method, article, or apparatus.

While the present invention has been described with reference to particular embodiments, it should be understood that the embodiments are illustrative and that the scope of the invention is not limited to these embodiments. Many variations, modifications, additions and improvements to the embodiments described above are possible. It is contemplated that these variations, modifications, additions and improvements fall within the scope of the invention as detailed within the following claims.

What is claimed is:

1. A system for dynamically adjusting the slicing level for burst mode optical receivers, comprising:
    a top-hold circuit configured to identify a maximum level of a data signal received from a photodetector, wherein the data signal embodies a data packet containing bits, and wherein the top-hold circuit is initially charged to the lowest possible maximum signal level, the top-hold circuit comprising a first capacitor and being configured to charge the first capacitor to the maximum level of the data signal, the top-hold circuit also comprising a first diode to be coupled between a data signal input and the first capacitor;
    a bottom-hold circuit configured to identify a minimum level of a data signal, wherein the bottom-hold circuit is initially charged to the highest possible minimum signal level, the bottom-hold circuit comprising a second capacitor and being configured to charge the second capacitor to the minimum level of the data signal, the bottom-hold circuit also comprising a second diode to be coupled between the data signal input and the second capacitor, the second diode being of an opposite polarity to the first diode with respect to the data signal input; and
    a slicing level circuit configured to identify and select a slicing level between the minimum and maximum levels of the data signal;
    the system further comprising a first log differential operational amplifier to be coupled between the first diode and the data signal input and a second log differential operational amplifier to be coupled between the second diode and the data signal input,
    wherein receipt of each new data signal causes re-initialization of the top-hold circuit to the lowest possible maximum signal level and the bottom-hold circuit to the highest possible minimum signal level.

2. The system of claim 1, wherein the slicing level circuit comprises a first resistance between a measurement junction and the first capacitor; a second resistance between the measurement junction and the second capacitor; wherein the first resistance is equal to the second resistance; and wherein the slicing level is produced at the measurement junction.

3. The system of claim 1, wherein the top-hold circuit comprises a first rectifier circuit to be coupled between a data signal input and the first capacitor, and wherein the bottom-hold circuit comprises a second rectifier circuit to be coupled between the data signal input and the second capacitor; wherein the polarities of the first and second rectifier circuits with respect to the data signal input are opposite.

4. The system of claim 1, wherein the top-hold circuit comprises a double emitter-follower circuit.

5. The system of claim 1, wherein upon the occurrence of a reset event, the top-hold circuit is configured to initialize the first capacitor to a first initialization voltage level and the bottom-hold circuit is configured to initialize the second capacitor to a second initialization voltage level, wherein the first initialization voltage level is the lowest possible maximum level of the data signal and the second initialization voltage level is the highest possible minimum level of the data signal.

6. The system of claim 1, wherein the slicing level circuit is configured to identify the slicing level by determining an average of the minimum and maximum levels of the data signal.

7. The system of claim 1, wherein the top-hold circuit comprises a first diode to be coupled between a data signal input and the first capacitor, and wherein the bottom-hold circuit comprises a second diode to be coupled between the data signal input and the first capacitor; wherein the polarities of the first and second diodes with respect to the data signal input are opposite.

8. An optical receiver comprising:
    a photodetector to receive an optical signal and to generate a corresponding data signal that embodies a data packet containing bits;
    a top-bottom-hold circuit to dynamically generate a slicing level signal based on the data signal, the top-bottom-hold circuit comprising a top-hold circuit to identify a maximum level of the data signal, wherein the top-hold circuit is initially charged to the lowest possible maximum signal level, a bottom-hold circuit to identify a minimum level of the data signal, wherein the bottom-hold circuit is initially charged to the highest possible minimum signal level, and a slicing level circuit to select a slicing level between the minimum and maximum levels of the data signal; and
    a limiting amplifier to produce a binary signal, which corresponds to the optical signal, using the slicing level;
    wherein the optical receiver further comprises a data signal input coupled to the top-bottom-hold circuit;
    wherein the top-hold circuit comprises a first capacitor and being configured to charge the first capacitor to the maximum level of the data signal, a first diode to be coupled between the data signal input and the first capacitor, and a first log differential operational amplifier to be coupled between the data signal input and the first diode;
    wherein the bottom-hold circuit comprises a second capacitor and being configured to charge the second capacitor to the minimum level of the data signal, a second diode to be coupled between the data signal input and the second capacitor, and a second log differential operational amplifier to be coupled between the data signal input and the second diode;
    wherein the polarities of the first and second diodes with respect to the data signal input are opposite, and
    wherein receipt of each new data signal causes re-initialization of the top-hold circuit to the lowest possible maximum signal level and the bottom-hold circuit to the highest possible minimum signal level.

9. The optical receiver of claim 8, wherein the top-hold circuit and the bottom-hold circuit reset to the lowest possible maximum signal level and the highest possible minimum signal level, respectively, for every incoming packet.

* * * * *